(12) United States Patent  (10) Patent No.: US 9,384,976 B2
Ichijo et al.  (45) Date of Patent: Jul. 5, 2016

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Mitsuhiro Ichijo, Zama (JP); Tetsuhiro Tanaka, Isehara (JP); Seiji Yasumoto, Tochigi (JP); Shun Mashiro, Oyama (JP); Yoshiaki Oikawa, Sagamihara (JP); Kenichi Okazaki, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/578,891

(22) Filed: Dec. 22, 2014

(65) Prior Publication Data

US 2015/0140732 A1    May 21, 2015

Related U.S. Application Data

(63) Continuation of application No. 12/938,527, filed on Nov. 3, 2010, now Pat. No. 8,927,351.

(30) Foreign Application Priority Data

Nov. 6, 2009   (JP) .................................. 2009-255154

(51) Int. Cl.
*H01L 21/00* (2006.01)
*H01L 21/02* (2006.01)
(Continued)

(52) U.S. Cl.
CPC ........ *H01L 21/02614* (2013.01); *C23C 16/308* (2013.01); *C23C 16/45578* (2013.01); *C23C 16/511* (2013.01); *H01J 37/3244* (2013.01); *H01J 37/32192* (2013.01);
(Continued)

(58) Field of Classification Search
None
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2020686 A   2/2009
(Continued)

OTHER PUBLICATIONS

Written Opinion (Application No. PCT/JP2010/068788) Dated December 28, 2010.
(Continued)

*Primary Examiner* — Evren Seven
(74) *Attorney, Agent, or Firm* — Robinson Intellectual Property Law Office; Eric J. Robinson

(57) ABSTRACT

It is an object to drive a semiconductor device at high speed or to improve the reliability of the semiconductor device. In a method for manufacturing the semiconductor device, in which a gate electrode is formed over a substrate with an insulating property, a gate insulating film is formed over the gate electrode, and an oxide semiconductor film is formed over the gate insulating film, the gate insulating film is formed by deposition treatment using high-density plasma. Accordingly, dangling bonds in the gate insulating film are reduced and the quality of the interface between the gate insulating film and the oxide semiconductor is improved.

20 Claims, 16 Drawing Sheets

(51) Int. Cl.

| | | |
|---|---|---|
| C23C 16/30 | (2006.01) | |
| C23C 16/455 | (2006.01) | |
| C23C 16/511 | (2006.01) | |
| H01J 37/32 | (2006.01) | |
| H01J 37/34 | (2006.01) | |
| H01L 29/49 | (2006.01) | |
| H01L 29/786 | (2006.01) | |
| H01L 29/66 | (2006.01) | |

(52) U.S. Cl.
CPC .......... *H01J 37/32449* (2013.01); *H01J 37/34* (2013.01); *H01L 21/02274* (2013.01); *H01L 29/4908* (2013.01); *H01L 29/66742* (2013.01); *H01L 29/66969* (2013.01); *H01L 29/7869* (2013.01); *H01L 21/0237* (2013.01); *H01L 21/02554* (2013.01); *H01L 21/02565* (2013.01); *H01L 21/02631* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,083,701 B2 | 8/2006 | Ohmi et al. |
| 7,105,868 B2 | 9/2006 | Nause et al. |
| 7,211,825 B2 | 5/2007 | Shih et al |
| 7,217,971 B2 | 5/2007 | Iwasaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,358,578 B2 | 4/2008 | Iwasaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,465,674 B2 | 12/2008 | Tamura et al. |
| 7,468,304 B2 | 12/2008 | Kaji et al. |
| 7,501,293 B2 | 3/2009 | Ito et al. |
| 7,520,245 B2 | 4/2009 | Ohmi et al. |
| 7,608,899 B2 | 10/2009 | Iwasaki et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,791,074 B2 | 9/2010 | Iwasaki |
| 7,807,515 B2 | 10/2010 | Kato et al. |
| 7,884,360 B2 | 2/2011 | Takechi et al. |
| 7,906,780 B2 | 3/2011 | Iwasaki |
| 7,910,932 B2 | 3/2011 | Marks et al. |
| 7,919,365 B2 | 4/2011 | Kim et al. |
| 7,935,582 B2 | 5/2011 | Iwasaki |
| 7,956,361 B2 | 6/2011 | Iwasaki |
| 7,977,675 B2 | 7/2011 | Kawamura et al. |
| 8,148,245 B2 | 4/2012 | Ikisawa et al. |
| 8,154,024 B2 | 4/2012 | Iwasaki |
| 8,193,045 B2 | 6/2012 | Omura et al. |
| 8,258,021 B2 | 9/2012 | Ng et al. |
| 8,420,442 B2 | 4/2013 | Takechi et al. |
| 8,785,240 B2 | 7/2014 | Watanabe |
| 8,889,480 B2 | 11/2014 | Takechi et al. |
| 9,209,026 B2 | 12/2015 | Takechi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0183274 A1 | 8/2006 | Carcia et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231208 A1 | 10/2006 | Ohmi et al. |
| 2006/0231882 A1 | 10/2006 | Kim et al. |
| 2006/0238132 A1 | 10/2006 | Kitamura et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0213504 A1 | 9/2008 | Ishikawa |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299689 A1 | 12/2008 | Yamazaki |
| 2009/0008639 A1 | 1/2009 | Akimoto et al. |
| 2009/0047752 A1 | 2/2009 | Yamazaki et al. |
| 2009/0068773 A1 | 3/2009 | Lai et al. |
| 2009/0073325 A1 | 3/2009 | Kuwabara et al. |
| 2009/0108304 A1 | 4/2009 | Ng et al. |
| 2009/0108413 A1 | 4/2009 | Ohmi |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0203174 A1 | 8/2009 | Ichijo et al. |
| 2009/0239335 A1 | 9/2009 | Akimoto et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065838 A1 | 3/2010 | Yamazaki et al. |
| 2010/0065844 A1 | 3/2010 | Tokunaga |

(56) References Cited

U.S. PATENT DOCUMENTS

| | | | |
|---|---|---|---|
| 2010/0092800 A1 | 4/2010 | Itagaki et al. | |
| 2010/0101834 A1 | 4/2010 | Ohmi et al. | |
| 2010/0109002 A1 | 5/2010 | Itagaki et al. | |
| 2010/0295042 A1 | 11/2010 | Yano et al. | |
| 2011/0014745 A1 | 1/2011 | Miyanaga | |
| 2011/0090416 A1 | 4/2011 | Arasawa et al. | |
| 2011/0111557 A1* | 5/2011 | Ichijo | C23C 16/308 438/104 |
| 2014/0077208 A1* | 3/2014 | Matsukura | H01L 27/1225 257/43 |

FOREIGN PATENT DOCUMENTS

| | | |
|---|---|---|
| EP | 2226847 A | 9/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-166838 A | 7/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-353442 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-013128 A | 1/2007 |
| JP | 2007-073558 A | 3/2007 |
| JP | 2007-073559 A | 3/2007 |
| JP | 2007-096055 A | 4/2007 |
| JP | 2007-103918 A | 4/2007 |
| JP | 2007-123861 A | 5/2007 |
| JP | 2007-142196 A | 6/2007 |
| JP | 2007-201366 A | 8/2007 |
| JP | 2008-042088 A | 2/2008 |
| JP | 2008-091571 A | 4/2008 |
| JP | 2008-243929 A | 10/2008 |
| JP | 2008-281988 A | 11/2008 |
| JP | 2009-010362 A | 1/2009 |
| JP | 2008-234603 | 3/2009 |
| JP | 2009-205921 A | 9/2009 |
| JP | 2009-231611 A | 10/2009 |
| JP | 2009-260002 A | 11/2009 |
| JP | 2010-093238 A | 4/2010 |
| JP | 2011-057941 A | 3/2011 |
| WO | WO-2004/114391 | 12/2004 |
| WO | WO-2007/029844 | 3/2007 |
| WO | WO-2007/086291 | 8/2007 |
| WO | WO-2007/139009 | 12/2007 |
| WO | WO-2008/126879 | 10/2008 |
| WO | WO-2008/149873 | 12/2008 |
| WO | WO-2009/084537 | 7/2009 |
| WO | WO-2009/093625 | 7/2009 |

OTHER PUBLICATIONS

Yamamoto.Y et al., "Characterization of the eolian dust sources by ESR of impurity centers in quartz", Advances in ESR Applications, 2009, vol. 25, pp. 7-12.

International Search Report (Application No. PCT/JP2010/068788) Dated Dec. 28, 2010.

Written Opinion (Application No. PCT/JP2010/068788) Dated Dec. 28, 2010.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (M = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films By Irradiation With Ultraviolet Lamp", Journal Of Sol-Gel Science And Technology, 2003, vol. 26, pp. 181-184.

Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal Of Solid State Chemistry, 1998, vol. 139, pp. 347-355.

Son.K et al., "42.4L: Late-News Paper: 4 Inch QVGA Amoled Driven By The Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs ", IDW '02: Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., Optical Studies of the Amorphous Liquid-Cholesteric Liquid Crystal Transition:The "Blue Phase", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID DIgest '09: SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.
Jin.D et al., "65.2:Distinguished Paper:World-Largest (6.5) Flexible Full Color Top Emission AMOLED Display on Plastic Film and Its Bending Properties", SID Digest '09: SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZNO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09: SID International Symposium Digest of Technical Papers, May 31, 2009, pp. 284-287.
Miyasaka.M, "SUFTLA Flexible Microelectronics on Their Way to Business", SID Digest '07: SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.
Lee.H et al., "Current Status of, Challenges to, and Perspective View of AM-OLED", IDW '06: Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,Or Zn] at Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Orita.M et al., "Mechanism of Electrical Conductivity of Transparent InGaZnO4", Phys. Rev. B. (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving The Gate Stability Of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

FIG. 10A

| Item | Detail | Result |
|---|---|---|
| TFT characteristics | Electron mobility in saturation region (Vd=10V) | $10 cm^2/Vs$ |
| | On-off ratio (Vd=10V) | 9 digits or more |
| | Ion (Vd=10V, Vg=15V) | 1.6E-4A |
| | Ioff_min (room temperature, Vd=10V) | 1E-13A or lower |
| | Ioff_min (85°C, Vd=10V) | 1E-13A or lower |
| | Ioff (Vg=min-10V, Vd=10V) | 1E-13A or lower |
| | Vth (Vd=10V) | 1.8V, ±1.0V |
| Reliablity (gate BT test) | \|ΔVth\| (85°C, Vg=±20V, Vd=0.1V, 12hr., air) | 0.46V (+20V) |
| | | -0.89V (-20V) |
| | \|ΔVth\| (150°C, Vg=±20V, Vd=0.1V, 1hr., air) | 0.33V (+20V) |
| | | -0.19V (-20V) |

FIG. 10B

| Item | Detail | Result |
|---|---|---|
| TFT characteristics | Electron mobility in saturation region (Vd=10V) | $8 cm^2/Vs$ |
| | On-off ratio (Vd=10V) | 9 digits or more |
| | Ion (Vd=10V, Vg=15V) | 2.6E-4[A] |
| | Ioff_min (room temerature, Vd=10V) | 1E-13A or lower |
| | Ioff_min (85°C, Vd=10V) | 1E-13A or lower |
| | Ioff (Vg=min-10V, Vd=10V) | 1E-13A or lower |
| | Vth (Vd=10V) | -2.2V, ±4.2V |
| Reliablity (gate BT test) | \|ΔVth\| (85°C, Vg=±20V, Vd=0.1V, 12hr., air) | 0.15V (+20V) |
| | | -2.73V (-20V) |
| | \|ΔVth\| (150°C, Vg=±20V, Vd=0.1V, 1hr., air) | -1.35V (+20V) |
| | | -0.89V (-20V) |

FIG. 11A

| Item | Detail | Result |
|---|---|---|
| TFT characteristics | Electron mobility in saturation region (Vd=10V) | 10cm$^2$/Vs |
| | On-off ratio (Vd=10V) | 9 digits or more |
| | Ion (Vd=10V, Vg=15V) | 3.0E-4A |
| | Ioff_min (room temperature, d=10V) | 1E-13A or lower |
| | Ioff_min (85°C, Vd=10V) | 1E-13A or lower |
| | Ioff (Vg=min-10V, Vd=10V) | 1E-13A or lower |
| | Vth (Vd=10V) | 1.5V, ±0.5V |
| Reliablity (gate BT test) | \|ΔVth\| (85°C, Vg=±20V, Vd=0.1V, 12hr., air) | 0.49V (+20V) |
| | | -0.78V (-20V) |
| | \|ΔVth\| (150°C, Vg=±20V, Vd=0.1V, 1hr., air) | 0.18V (+20V) |
| | | -0.20V (-20V) |

FIG. 11B

| Item | Detail | Result |
|---|---|---|
| TFT characteristics | Electron mobility in saturation region (Vd=10V) | 10cm$^2$/Vs |
| | On-off ratio (Vd=10V) | 9 digits or more |
| | Ion (Vd=10V, Vg=15V) | 1.6E-4A |
| | Ioff_min (room temperature, Vd=10V) | 1E-13A or lower |
| | Ioff_min (85°C, Vd=10V) | 1E-13A or lower |
| | Ioff (Vg=min-10V, Vd=10V) | 1E-13A or lower |
| | Vth (Vd=10V) | 1.8V, ±1.0V |
| Reliablity (gate BT test) | \|ΔVth\| (85°C, Vg=±20V, Vd=0.1V, 12hr., air) | 0.46V (+20V) |
| | | -0.89V (-20V) |
| | \|ΔVth\| (150°C, Vg=±20V, Vd=0.1V, 1hr., air) | 0.33V (+20V) |
| | | -0.19V (-20V) |

METHOD FOR MANUFACTURING SEMICONDUCTOR DEVICE

TECHNICAL FIELD

The present invention relates to a semiconductor device and a method for manufacturing the semiconductor device. The present invention particularly relates to a semiconductor device including an oxide semiconductor and a method for manufacturing the semiconductor device. Further, the present invention relates to an apparatus used for manufacturing a semiconductor device.

BACKGROUND ART

A thin film transistor including a semiconductor film formed over an insulating surface is an essential semiconductor element for a semiconductor device. Since there is limitation on the allowable temperature limit of a substrate in manufacture of a thin film transistor, a thin film transistor in which amorphous silicon that can be deposited at a relatively low temperature, polysilicon that can be obtained by crystallization with use of laser light or a catalytic element, or the like is included in an active layer is mainly used for a semiconductor display device.

In recent years, a metal oxide having semiconductor characteristics which is referred to as an oxide semiconductor has attracted attention as a novel semiconductor material which has both high electron mobility, which is a characteristic of polysilicon, and uniform element characteristics, which is a characteristic of amorphous silicon. The metal oxide is used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, and zinc oxide. Thin film transistors in which a channel formation region is formed using such a metal oxide having semiconductor characteristics are known (Patent Documents 1 and 2).

REFERENCE

[Patent Document 1] Japanese Published Patent Application No. 2007-123861
[Patent Document 2] Japanese Published Patent Application No. 2007-96055

DISCLOSURE OF INVENTION

A transistor used for a semiconductor device is required to have favorable transistor characteristics such as on current, off current, and electron mobility. By using a transistor having favorable characteristics, the semiconductor device can be driven at higher speed. In addition, by preventing deterioration or variation of a transistor to improve the reliability, a highly reliable semiconductor device can be provided.

Thus, it is an object to provide a semiconductor device which can be driven at high speed and a method for manufacturing the semiconductor device. It is another object to provide a highly reliable semiconductor device and a method for manufacturing the semiconductor device.

It is another object to provide a novel CVD apparatus.

According to an embodiment of the present invention, the purity of an oxide semiconductor used in a channel formation region of a transistor is increased and the quality of a gate insulating film which is in contact with the oxide semiconductor is improved. In other words, an i-type or substantially i-type oxide semiconductor (a highly purified oxide semiconductor) which is obtained by removal of an impurity is extremely sensitive to an interface state or an interface charge; therefore, the conditions of a gate insulating film and the interface between the gate insulating film and an oxide semiconductor film need to be kept favorable.

In order to increase the purity of the oxide semiconductor, it is necessary to remove, from the oxide semiconductor, hydrogen that serves as a donor in the oxide semiconductor and becomes a factor causing the oxide semiconductor to be an n-type oxide semiconductor. Then, oxygen is supplied to a deficient portion from which hydrogen is removed and oxygen is supplied to compensate oxygen which is lost at the same time as the removal of hydrogen, whereby the oxide semiconductor film is highly purified.

Further, a dense insulating film having few defects is used as the gate insulating film which is in contact with the highly purified oxide semiconductor film.

The defect here refers to a dangling bond or the like in the gate insulating film. By reducing the dangling bond or the like, the characteristics of the interface between the oxide semiconductor and the gate insulating film becomes favorable and the transistor characteristics are improved.

Therefore, in accordance with the present invention, as a method for reducing dangling bonds in the gate insulating film, formation of a gate insulating film by deposition treatment using high-density plasma is provided.

By using high-density plasma, plasma damage to the gate insulating film is reduced and thus a gate insulating film in which defects are largely reduced is formed.

An embodiment of the present invention is a method for manufacturing a semiconductor device which includes a gate electrode, an oxide semiconductor film, and a gate insulating film that is formed using a high-density plasma CVD apparatus, including the steps of: setting a substrate to face a dielectric plate provided in a reaction chamber of the high-density plasma CVD apparatus; ejecting a gas for generating plasma toward the dielectric plate to generate plasma; and ejecting a source gas of the gate insulating film toward the substrate, so that the gate insulating film is formed.

Another embodiment of the present invention is a method for manufacturing a semiconductor device which includes a gate electrode, an oxide semiconductor film, and a gate insulating film that is formed using a high-density plasma CVD apparatus, including the steps of: setting a substrate to face a dielectric plate provided in a reaction chamber of the high-density plasma CVD apparatus; ejecting a gas for generating plasma toward the dielectric plate from a first gas pipe to generate plasma; and ejecting a source gas of the gate insulating film toward the substrate from a second gas pipe which is provided to intersect with the first gas pipe, so that the gate insulating film is formed.

Another embodiment of the present invention is a method for manufacturing a semiconductor device which includes a gate electrode, an oxide semiconductor film, and a gate insulating film that is formed using a high-density plasma CVD apparatus, including the steps of: setting a substrate to face a dielectric plate provided in a reaction chamber of the high-density plasma CVD apparatus; ejecting a gas for generating plasma toward the substrate to generate plasma; and ejecting a source gas of the gate insulating film toward the substrate, so that the gate insulating film is formed.

Another embodiment of the present invention is a method for manufacturing a semiconductor device which includes a gate electrode, an oxide semiconductor film, and a gate insulating film that is formed using a high-density plasma CVD apparatus, including the steps of: setting a substrate to face a dielectric plate provided in a reaction chamber of the high-density plasma CVD apparatus; ejecting a gas for generating plasma toward the substrate from a member provided in parallel with the dielectric plate to generate plasma; and ejecting a source gas of the gate insulating film toward the substrate from a gas pipe which is provided to intersect with the member, so that the gate insulating film is formed.

By forming a gate insulating film with use of a high-density plasma CVD apparatus, the characteristics of the interface between an oxide semiconductor film and the gate insulating film can be improved.

By improving the interface characteristics, the transistor characteristics such as on current, off current, electron mobility, and reliability become favorable; accordingly, a semiconductor device can operate at high speed and the reliability thereof can be improved.

BRIEF DESCRIPTION OF DRAWINGS

In the accompanying drawings:
FIGS. 10A and 10B show characteristics of transistors;
FIGS. 11A and 11B show characteristics of transistors.

BEST MODE FOR CARRYING OUT THE INVENTION

Embodiments of the present invention will be described below with reference to the drawings. Note that the present invention can be implemented in many different modes, and it is easily understood by those skilled in the art that modes and details of the present invention can be modified in various ways without departing from the sprit and the scope of the present invention. Therefore, the present invention is not construed as being limited to description of the embodiments.

Embodiment 1

A method for manufacturing a semiconductor device will be described with reference to FIGS. 1A to 1E by taking a bottom-gate thin film transistor having a channel-etched structure as an example.

Figure 1A:
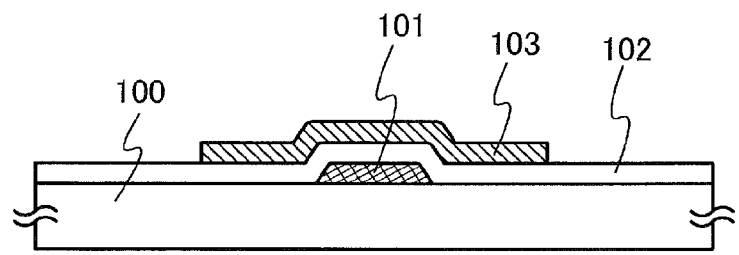
FIGS. 1A to 1E are cross-sectional views of a semiconductor device.
Figure 1B:
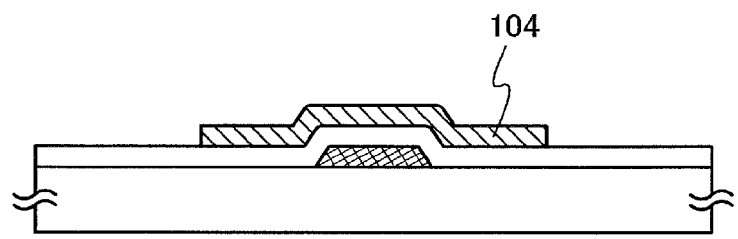

As illustrated in FIG. 1A, a gate electrode 101 is formed over a substrate 100. As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a plastic substrate with heat resistance enough to withstand a process temperature in this manufacturing process; or the like. Alternatively, a metal substrate such as a stainless steel alloy substrate having a surface provided with an insulating layer may be used. As the substrate 100, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

An insulating film serving as a base film may be formed between the substrate 100 and the gate electrode 101. As the base film, for example, a single layer of a silicon oxide film, a silicon oxynitride film, a silicon nitride film, a silicon nitride oxide film, an aluminum nitride film, or an aluminum nitride oxide film or a stacked layer of a plurality of these films can be used. In particular, when an insulating film with a high barrier property, such as a silicon nitride film, a silicon nitride oxide film, an aluminum nitride film, or an aluminum nitride oxide film is used as the base film, impurities in an atmosphere such as moisture or hydrogen, or impurities included in the substrate 100 such as alkali metal or heavy metal can be prevented from entering an oxide semiconductor film, a gate insulating film, an interface between the oxide semiconductor film and the gate insulating film or the like, or the vicinity of the interface.

In this specification, oxynitride refers to a substance which includes more oxygen than nitrogen, and nitride oxide refers to a substance which includes more nitrogen than oxygen. For example, silicon oxynitride is a substance including oxygen, nitrogen, silicon, and hydrogen in the ranges of greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, silicon nitride oxide is a substance including oxygen, nitrogen, silicon, and hydrogen in the ranges of greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively. Note that the above ranges are obtained by measurement using Rutherford backscattering spectrometry (RBS) or hydrogen forward scattering spectrometry (HFS). In addition, the total of the percentages of the constituent elements does not exceed 100 atomic %.

The gate electrode 101 can be formed using a single layer or a stacked layer of one or more conductive films including a metal material such as molybdenum, titanium, chromium, tantalum, tungsten, neodymium, or scandium, or an alloy material which includes any of these metal materials as a main component; or a nitride of any of these metals. Note that aluminum or copper can also be used as the above metal material as long as it can withstand the temperature of heat treatment performed in a later step. Aluminum or copper is preferably used in combination with a refractory metal material in order to avoid problems of heat resistance and corrosion. As the refractory metal material, molybdenum, titanium, chromium, tantalum, tungsten, neodymium, scandium, or the like can be used.

For example, as a two-layer structure of the gate electrode 101, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 101, the following structure is preferable: a stacked-layer structure including an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, when a light-transmitting oxide conductive film of indium oxide, an alloy of indium oxide and tin oxide, an alloy of indium oxide and zinc oxide, zinc oxide, zinc aluminum oxide, zinc aluminum oxynitride, zinc gallium oxide, or the like is used for the gate electrode 101, the aperture ratio of a pixel portion can be improved.

The gate electrode 101 is formed to a thickness of 10 nm to 400 nm, preferably 100 nm to 200 nm. In this embodiment, a conductive film for the gate electrode is formed to a thickness of 150 nm by a sputtering method using a tungsten target, and then the conductive film is processed (patterned) into a desired shape by etching; thus, the gate electrode 101 is formed.

Next, a gate insulating film 102 is formed over the gate electrode 101.

The gate insulating film 102 is preferably formed by deposition treatment using high-density plasma. With high-density plasma, plasma damage to the gate insulating film 102 can be reduced. Accordingly, dangling bonds in the gate insulating film 102 can be reduced and defects can be reduced; thus, the interface with an oxide semiconductor formed later can be highly favorable.

The gate insulating film 102 can be formed to have a single-layer or stacked-layer structure with use of any of materials such as a silicon oxide film, a silicon nitride film, a silicon oxynitride film, and a silicon nitride oxide film. For example, a silicon oxynitride film is formed using silane and nitrogen monoxide as a deposition gas. The thickness of the gate insulating film 102 is greater than or equal to 100 nm and less than or equal to 500 nm. In the case of a stacked-layer structure, for example, a first gate insulating film with a thickness of greater than or equal to 50 nm and less than or equal to 200 nm and a second gate insulating film with a thickness of greater than or equal to 5 nm and less than or equal to 300 nm are stacked in this order.

Further, the gate insulating film 102 can be formed by stacking a silicon oxide film or a silicon oxynitride film, and a silicon nitride film or a silicon nitride oxide film in this order from the substrate side. Alternatively, the gate insulating film 102 can be formed by stacking a silicon nitride film or a silicon nitride oxide film, a silicon oxide film or a silicon oxynitride film, and a silicon nitride film or a silicon nitride oxide film in this order from the substrate side.

In this embodiment, as the gate insulating film 102, a 100-nm-thick silicon oxynitride film is formed by plasma CVD using microwaves of 2.45 GHz as high-density plasma. In this specification, a microwave refers to a wave in the frequency range of 300 MHz to 300 GHz.

Note that before an oxide semiconductor film is formed by a sputtering method, dust attached to a surface of the gate insulating film 102 is preferably removed by reverse sputtering in which an argon gas is introduced and plasma is generated. The reverse sputtering refers to a method in which, without application of voltage to a target side, an RF power source is used for application of voltage to a substrate side in an argon atmosphere so that plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As the oxide semiconductor film, an oxide semiconductor film such as an In—Sn—Ga—Zn—O film, an In—Ga—Zn—O film, an In—Sn—Zn—O film, an In—Al—Zn—O film, a Sn—Ga—Zn—O film, an Al—Ga—Zn—O film, a Sn—Al—Zn—O film, an In—Zn—O film, a Sn—Zn—O film, an Al—Zn—O film, a Zn—Mg—O film, a Sn—Mg—O film, an In—Mg—O film, an In—O film, a Sn—O film, or a Zn—O film can be used. Further, the oxide semiconductor film may include $SiO_2$.

As the oxide semiconductor film, a thin film expressed by $InMO_3(ZnO)_m$ (m>0) can be used. Here, M represents one or more metal elements selected from Ga, Al, Mn, and Co. For example, M is Ga, Ga and Al, Ga and Mn, Ga and Co, or the like. An oxide semiconductor film whose composition formula is expressed by $InMO_3 (ZnO)_m$ (m>0) where Ga is included as M is referred to as an In—Ga—Zn—O oxide semiconductor, and a thin film of the In—Ga—Zn—O oxide semiconductor is also referred to as an In—Ga—Zn—O-based non-single-crystal film.

The thickness of the oxide semiconductor film is 10 nm to 300 nm, preferably 20 nm to 100 nm. In this embodiment, as the oxide semiconductor film, a 30-nm-thick In—Ga—Zn—O-based non-single-crystal film which is obtained by a sputtering method using a metal oxide target including indium (In), gallium (Ga), and zinc (Zn) ($In_2O_3:Ga_2O_3:ZnO=1:1:1$ or $In_2O_3:Ga_2O_3:ZnO=1:1:2$ in a molar ratio) is used. In this embodiment, a DC sputtering method is used, the flow rate of argon is 30 sccm, the flow rate of oxygen is 15 sccm, and the substrate temperature is room temperature.

Next, as illustrated in FIG. 1A, the oxide semiconductor film is processed (patterned) into a desired shape by etching or the like, so that an island-shaped oxide semiconductor film 103 is formed over the gate insulating film 102 to overlap with the gate electrode 101.

Next, the oxide semiconductor film 103 may be subjected to heat treatment in an atmosphere of an inert gas (such as nitrogen, helium, neon, or argon). When the heat treatment is performed on the oxide semiconductor film 103, an oxide semiconductor film 104 from which moisture and hydrogen are eliminated is formed. Specifically, rapid thermal annealing (RTA) treatment can be performed in an atmosphere of an inert gas (such as nitrogen, helium, neon, or argon) at a temperature of higher than or equal to 500° C. and lower than or equal to 750° C. (or a temperature lower than or equal to the strain point of the glass substrate) for approximately 1 minute to 10 minutes, preferably at 600° C. for approximately 3 minutes to 6 minutes. With an RTA method, dehydration or dehydrogenation can be performed in a short time; therefore, treatment can be performed even at a temperature higher than the strain point of the glass substrate. Note that the timing of the above heat treatment is not limited to after formation of the island-shaped oxide semiconductor film 103, and the oxide semiconductor film before being processed into the island-shaped oxide semiconductor film 103 may be subjected to the heat treatment. The heat treatment may also be performed plural times after the formation of the oxide semiconductor film 104.

In the island-shaped oxide semiconductor film 104, hydrogen included in the oxide semiconductor is reduced by the above heat treatment, and oxygen is introduced into a deficient portion from which hydrogen is removed and an oxygen-deficient portion, whereby the carrier concentration can be reduced, preferably to lower than $1\times10^{14}/cm^3$. By reducing impurities such as hydrogen which serves as a donor as much as possible in an oxide semiconductor with an energy gap of 2 eV or more, preferably 2.5 eV or more, more preferably 3 eV or more, the intrinsic carrier concentration thereof can be reduced to lower than or equal to $1.45\times10^{10}/cm^3$, which is that of silicon, and to approximately $10^{-7}/cm^3$ according to the Fermi-Dirac distribution law.

In this embodiment, heat treatment is performed for 6 minutes in a nitrogen atmosphere in the state where the substrate temperature reaches 600° C. For the heat treatment, a heating method using an electric furnace, a rapid heating method such as a gas rapid thermal annealing (GRTA) method using a heated gas or a lamp rapid thermal annealing (LRTA) method using lamp light, or the like can be used. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that in the heat treatment, it is preferable that moisture, hydrogen, and the like be not included in nitrogen or a rare gas such as helium, neon, or argon. It is preferable that the purity of nitrogen or a rare gas such as helium, neon, or argon which is introduced into a heat treatment apparatus be 6N (99.9999%) or higher, preferably 7N (99.99999%) or higher (that is, the impurity concentration is 1 ppm or lower, preferably 0.1 ppm or lower).

Alternatively, the heat treatment may be performed in air where the dew point under atmospheric pressure is −60° C. or lower and the moisture content is low, instead of an inert gas atmosphere such as a nitrogen atmosphere or a rare gas atmosphere.

The island-shaped oxide semiconductor film 104 which has been subjected to the heat treatment in an inert gas atmosphere is preferably in an amorphous state, but may be partly crystallized.

Figure 1C:
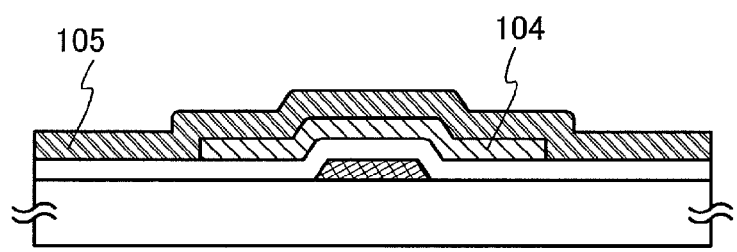

Next, as illustrated in FIG. 1C, a conductive film 105 used for a source electrode and a drain electrode is formed over the island-shaped oxide semiconductor film 104. The conductive film 105 is preferably formed using a material with low electronegativity, and may be formed using aluminum, magnesium, or the like by a sputtering method. Further, a film of titanium, tungsten, molybdenum, or the like which has low contact resistance with an oxide semiconductor may be formed between the oxide semiconductor film 104 and the conductive film 105 by a sputtering method. In order to prevent oxidation of the conductive film 105, a film of titanium, tungsten, molybdenum, or the like may be formed over the conductive film 105 by a sputtering method. A conductive film having a two-layer or three-layer structure is formed using any of these in combination as appropriate.

Note that the thickness of the conductive film 105 may be 100 nm to 500 nm.

Figure 1D:
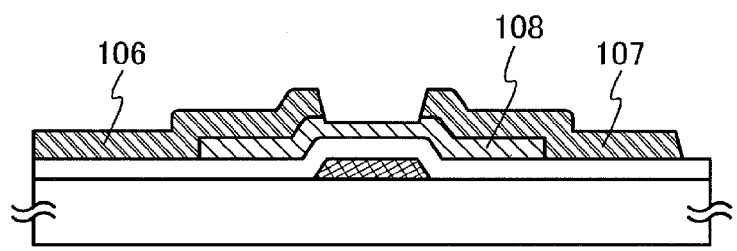

Next, as illustrated in FIG. 1D, the conductive film 105 is processed (patterned) into a desired shape by etching or the like, so that a source electrode 106 and a drain electrode 107 are formed.

In the patterning for forming the source electrode 106 and the drain electrode 107, an exposed portion of the island-shaped oxide semiconductor film 104 is partly etched, so that an island-shaped oxide semiconductor film 108 having a groove (a recessed portion) is formed.

Figure 1E:
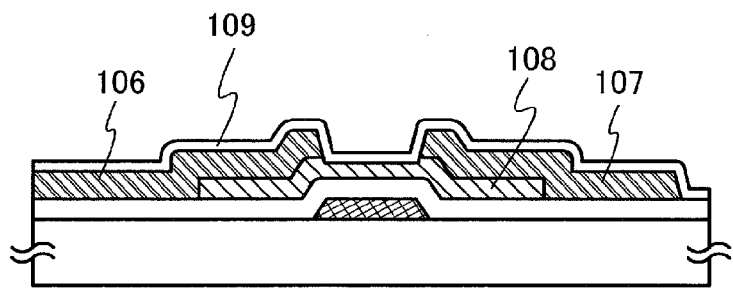

As illustrated in FIG. 1E, after the source electrode 106 and the drain electrode 107 are formed, an insulating film 109 is formed so as to cover the source electrode 106, the drain electrode 107, and the oxide semiconductor film 108.

As the insulating film 109, a 200-nm-thick silicon oxide film is formed by a sputtering method. The insulating film 109 can have a stacked-layer structure.

In this embodiment, impurities such as hydrogen included in the oxide semiconductor film are removed as much as possible to increase the purify of the oxide semiconductor film, and the interface characteristics with the gate insulating film which is in contact with the oxide semiconductor film are improved. Here, how such treatment affects the characteristics of a transistor is described below.

Figure 12:
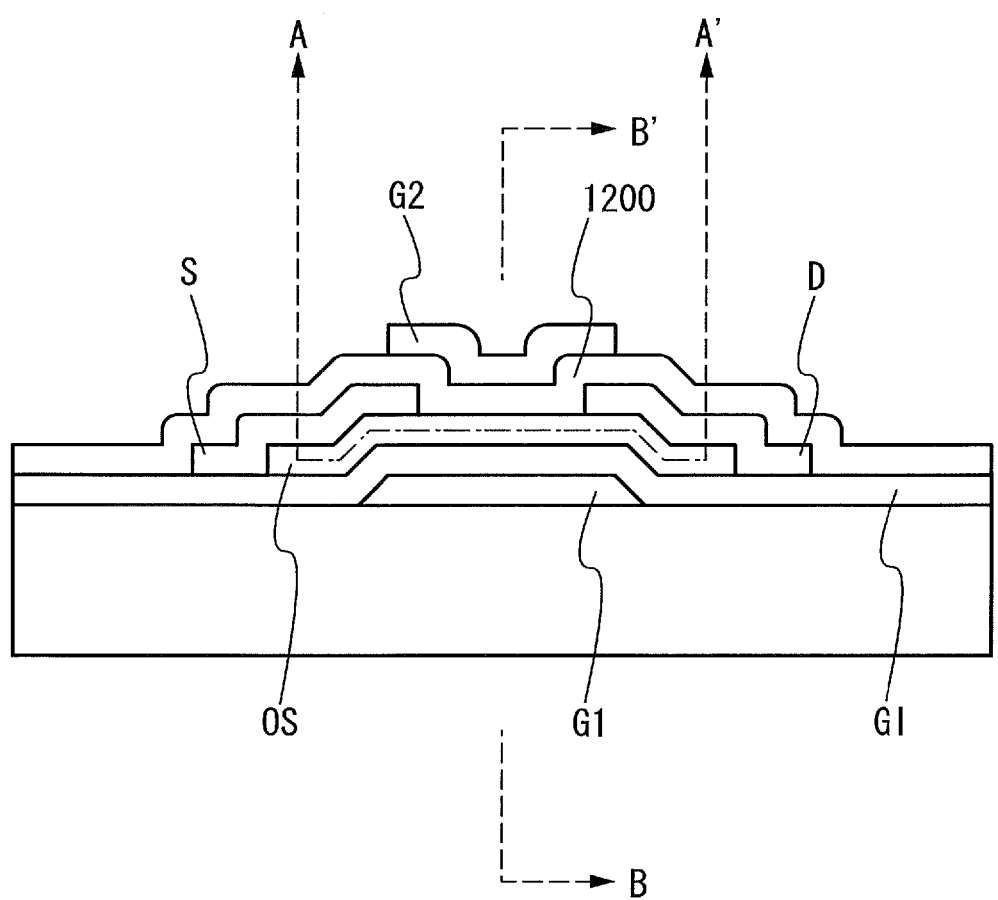
FIG. 12 is a longitudinal sectional view of a bottom-gate thin film transistor including an oxide semiconductor.

FIG. 12 is a cross-sectional view illustrating a thin film transistor manufactured in the above manner. An oxide semiconductor film (OS) is provided over a gate electrode (G1) with a gate insulating film (GI) interposed therebetween, and a source electrode (S) and a drain electrode (D) are provided over the oxide semiconductor film. Although a back-gate electrode (G2) is further provided in FIG. 12, the back-gate electrode (G2) is not necessarily provided.

Figure 13A:
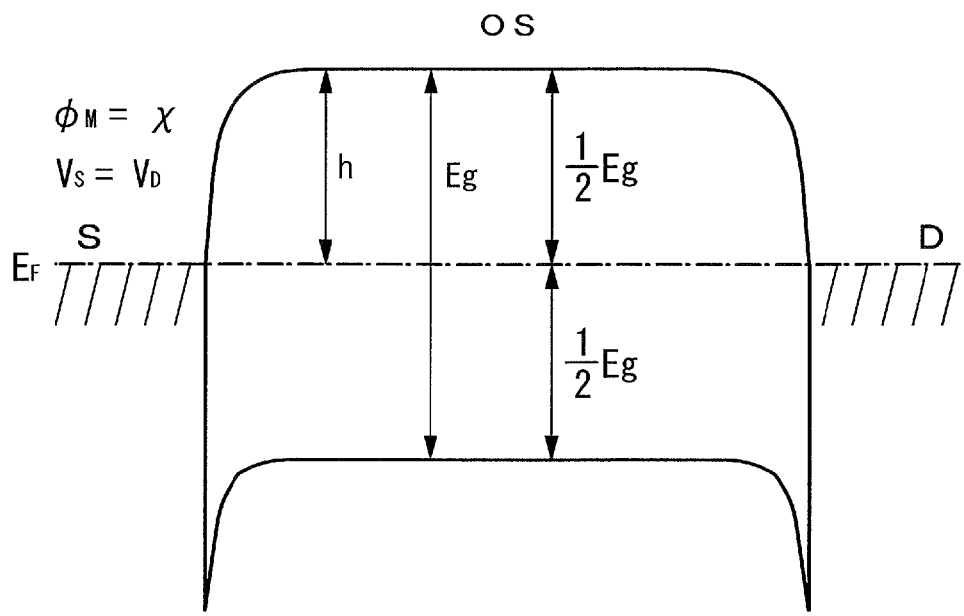
FIGS. 13A and 13B are energy band diagrams (schematic diagrams) along a section A-A' in FIG. 12.
Figure 13B:
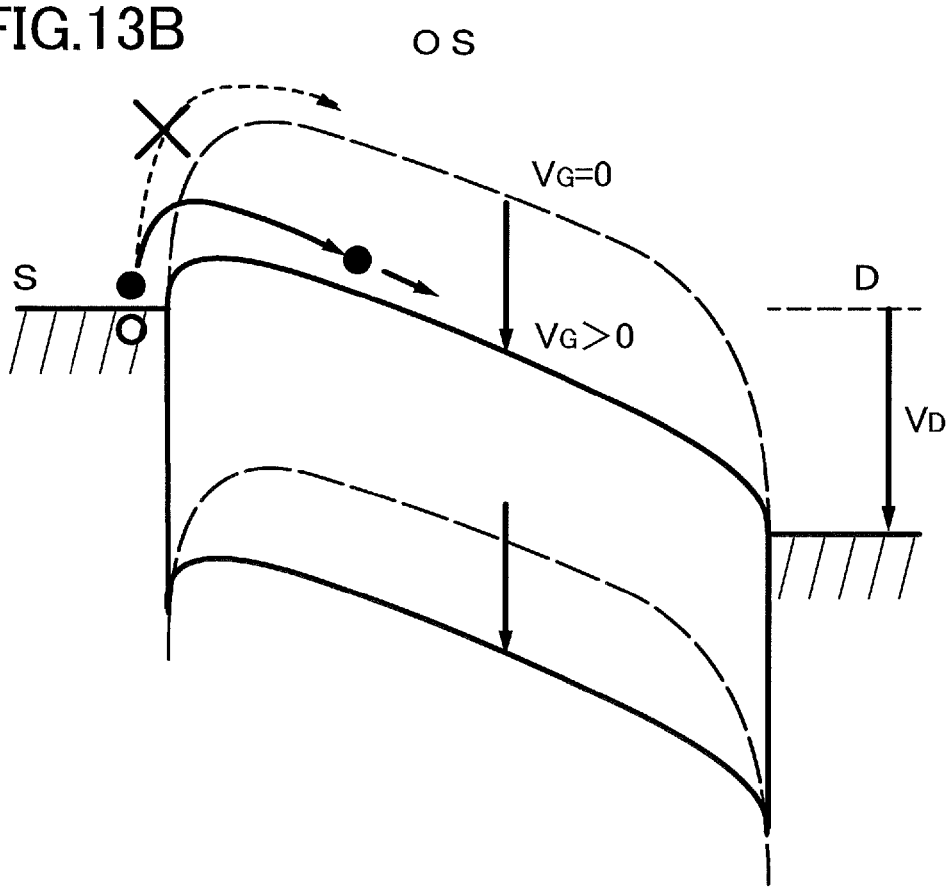

FIGS. 13A and 13B are energy band diagrams (schematic diagrams) on A-A' illustrated in FIG. 12. FIG. 13A illustrates the case where the voltage between the source and the drain is 0 V ($V_D=0$), and FIG. 13B illustrates the case where a positive potential with respect to the source is applied to the drain ($V_D>0$). Note that FIG. 13B illustrates the case where voltage is not applied to the gate ($V_G=0$) (shown by a dashed line) and the case where positive voltage ($V_G>0$) is applied to the gate (shown by a solid line). In the case where voltage is not applied to the gate, a carrier (electron) is not injected to the oxide semiconductor side from an electrode because of a high potential barrier, so that current does not flow, which means an off state. On the other hand, when positive voltage is applied to the gate, the potential barrier is lowered and thus current flows, which means an on state.

Figure 14A:
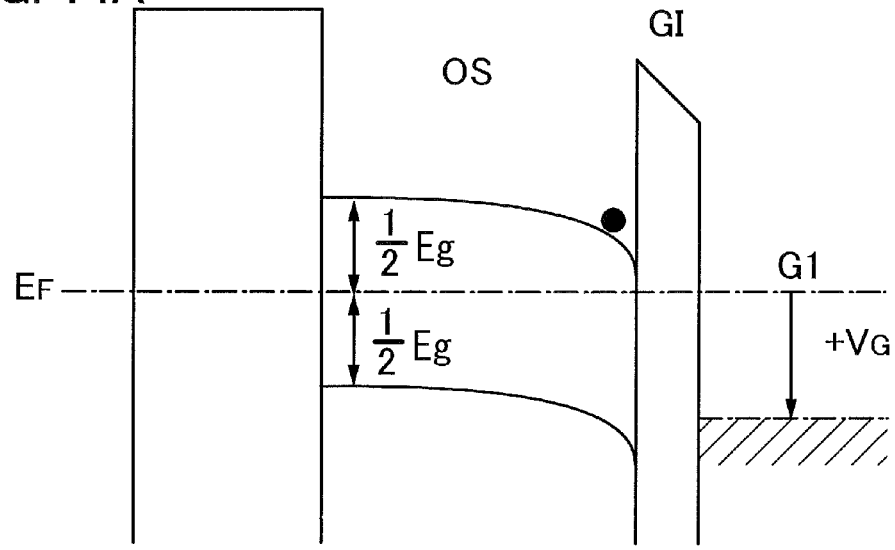
FIG. 14A illustrates the state where a positive potential (+VG) is applied to a gate (G1), and 14B illustrates the state where a negative potential (−VG) is applied to the gate (G1)
Figure 14B:
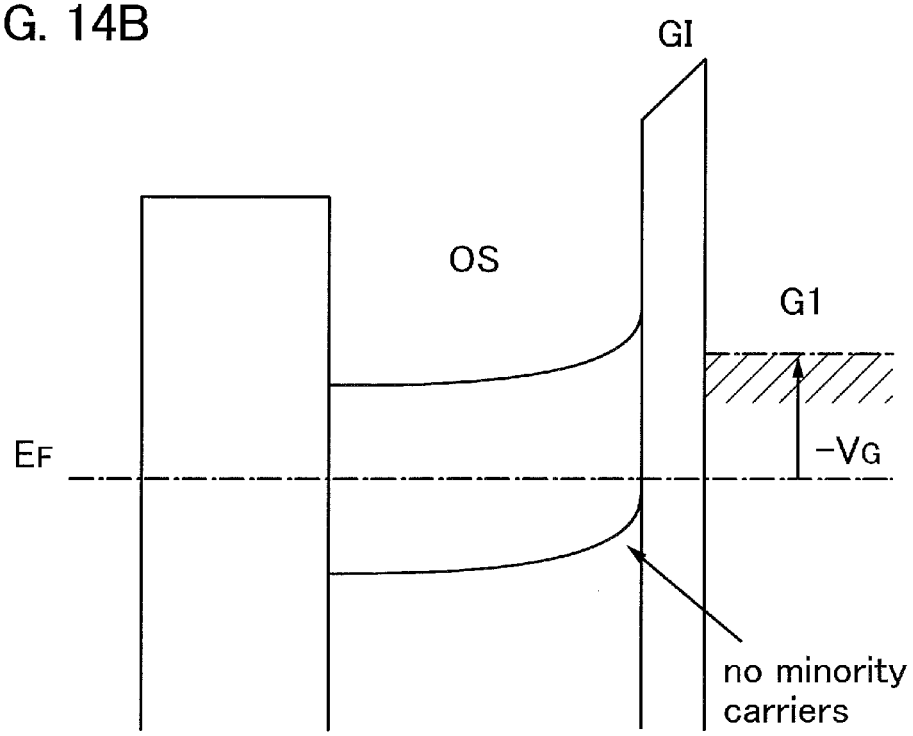

FIGS. 14A and 14B are energy band diagrams (schematic diagrams) on B-B' illustrated in FIG. 12. FIG. 14A illustrates an on state in which a positive potential (+VG) is applied to the gate (G1) and carriers (electrons) flow between the source and the drain. FIG. 14B illustrates an off state in which a negative potential (−VG) is applied to the gate (G1) and minority carriers do not flow.

Figure 15:
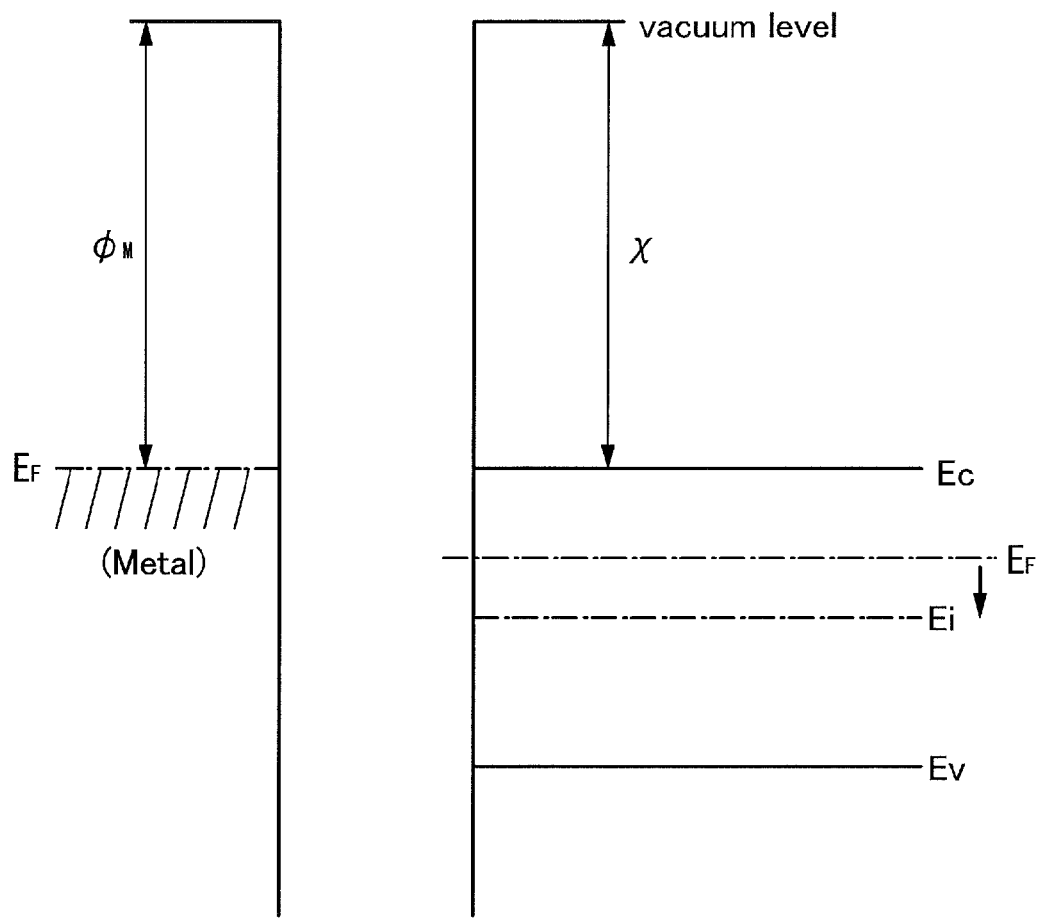
FIG. 15 illustrates relations between the vacuum level and the work function of a metal ($\phi M$) and between the vacuum level and the electron affinity ($\chi$) of an oxide semiconductor.

FIG. 15 shows relations between the vacuum level and the work function of a metal ($\phi M$) and between the vacuum level and the electron affinity ($\chi$) of an oxide semiconductor.

Electrons in metal degenerate at normal temperature, and its Fermi level is in a conduction band. On the other hand, a conventional oxide semiconductor is typically an n-type semiconductor, in which case the Fermi level ($E_F$) is away from the intrinsic Fermi level (Ei) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor of the present invention is an intrinsic (i-type) or a substantially intrinsic oxide semiconductor which is obtained by removing hydrogen that is an n-type impurity from an oxide semiconductor and purifying the oxide semiconductor so that the oxide semiconductor does not include an impurity other than a main component thereof as much as possible. In other words, a feature is that a purified i-type (intrinsic) semiconductor or a semiconductor close thereto is obtained not by adding an impurity but by removing an impurity such as hydrogen or water as much as possible. This enables the Fermi level ($E_F$) to be at the same level as the intrinsic Fermi level (Ei).

As one mode with which hydrogen is removed from the oxide semiconductor film (OS), metal with lower electronegativity than hydrogen may be used for a conductive film for the source electrode (S) and the drain electrode (D). By removing hydrogen that is an n-type impurity from the oxide semiconductor so that the oxide semiconductor does not include an impurity other than a main component thereof as much as possible, the oxide semiconductor can be highly purified.

As another mode, the oxygen concentration of the oxide semiconductor film (OS) may be increased. By increasing the concentration of oxygen that is a main component of the oxide semiconductor, hydrogen that is an impurity can be removed and the oxide semiconductor can be highly purified. Heat treatment for removing hydrogen from the oxide semiconductor film (OS) is also effective.

As another mode, an oxide film with high oxygen concentration may be formed as an insulating film 1200 over the oxide semiconductor film (OS). Oxygen is supplied from the insulating film 1200, whereby the oxygen concentration of the oxide semiconductor film (OS) can be increased. In addition, an effect of extraction of hydrogen in the oxide semiconductor film (OS) by oxygen in the insulating film 1200 is obtained. The oxygen concentration of the insulating film 1200 is set higher than the oxygen concentration of the oxide semiconductor film (OS). Further, in the case where the gate insulating film (GI) includes oxygen, hydrogen can also be efficiently extracted by the insulating film 1200 by setting the oxygen concentration of the insulating film 1200 higher than the oxygen concentration of the gate insulating film (G1). Note that the insulating film 1200 is preferably formed by a sputtering method.

These modes may be combined as appropriate. In this manner, by removing hydrogen from the oxide semiconductor as much as possible, the oxide semiconductor can be highly purified. The hydrogen concentration may be reduced to, when measured by SIMS measurement, $5 \times 10^{19}/cm^3$ or lower, preferably $5 \times 10^{18}/cm^3$ or lower, more preferably $5 \times 10^{17}/cm^3$ or lower.

In the case where the band gap (Eg) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi M$) and the electron affinity ($\chi$) of the oxide semiconductor are equal to each other and the metal and the oxide semiconductor are in contact with each other, an energy band diagram (a schematic diagram) like FIG. 13A is obtained.

In FIG. 13B, a black circle (●) represents an electron, and when a positive potential is applied to the drain, the electron is injected into the oxide semiconductor over the barrier (h) and flows toward the drain. In this case, the height of the barrier (h) changes depending on the gate voltage and the drain voltage; in the case where a positive drain voltage is applied, the height of the barrier (h) is smaller than the height of the barrier in FIG. 13A where no voltage is applied, i.e., ½ of the band gap (Eg).

At this time, the electron injected into the oxide semiconductor flows through the oxide semiconductor as illustrated in FIG. 14A. In addition, in FIG. 14B, when a negative potential (reverse bias) is applied to the gate electrode (G1), the value of current is extremely close to zero because holes that are minority carriers are substantially zero.

By increasing the purity of the oxide semiconductor so that the oxide semiconductor does not include an impurity other than a main component thereof as much as possible, an intrinsic (i-type) or substantially intrinsic oxide semiconductor is obtained. Consequently, the interface characteristics with the gate insulating film become apparent. Therefore, the interface characteristics need to be considered separately from bulk characteristics.

Accordingly, an insulating film formed using high-density plasma, according to an embodiment of the present invention, is preferably used as the gate insulating film in order to form a favorable interface with the oxide semiconductor.

By increasing the purity of an oxide semiconductor and forming a favorable interface between the oxide semiconductor and a gate insulating film, even an element with a channel width W of $1 \times 10^4$ μm and a channel length of 3 μm is highly expected to have the following characteristics of a thin film transistor: the off current is $10^{-13}$ A or less, and the subthreshold swing (S value) is 0.1 V/dec. (the thickness of the gate insulating film: 100 nm).

This embodiment can be combined with any of the other embodiments as appropriate.

Embodiment 2

In this embodiment, as an example of a mode using high-density plasma, a structure of a microwave plasma CVD apparatus and specific deposition treatment of a gate insulating film will be described with reference to FIG. 2 and FIG. 3.

Figure 2:
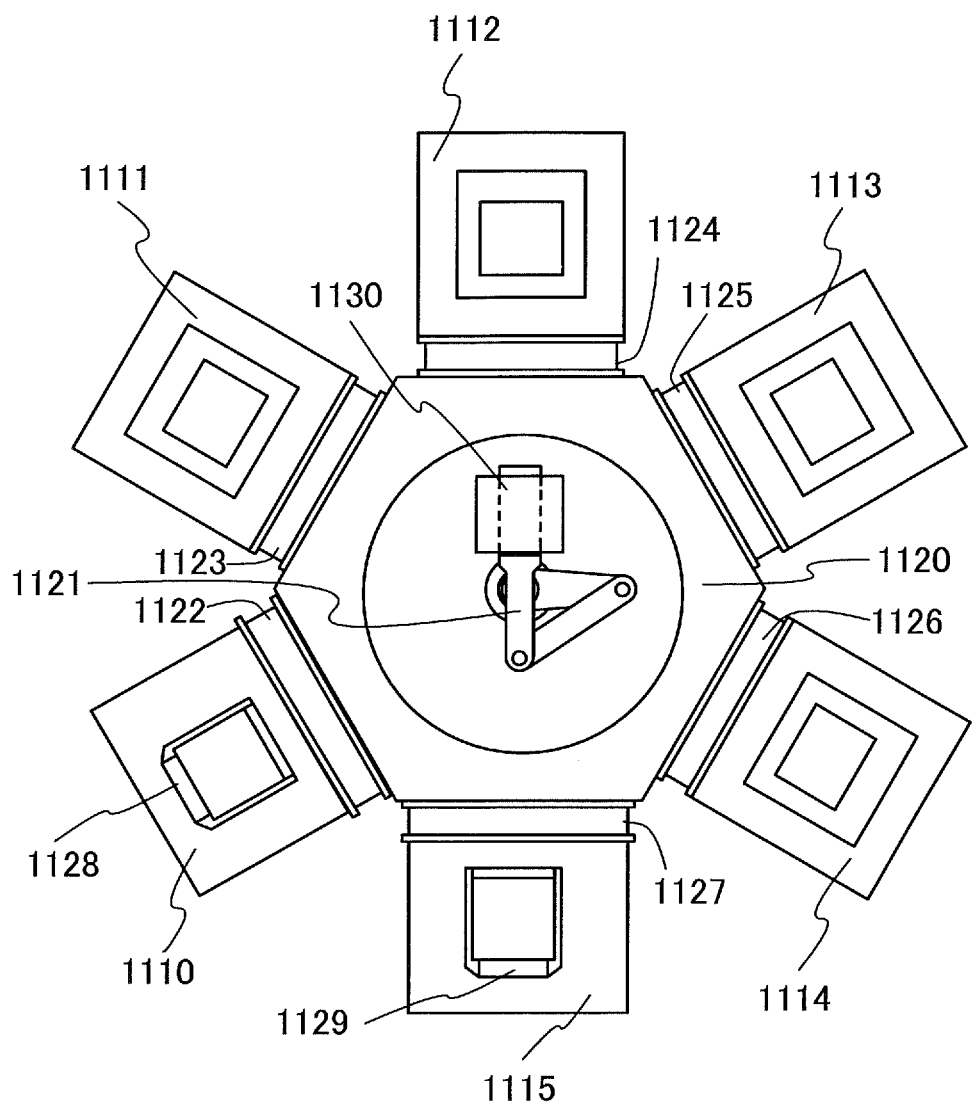
FIG. 2 is a top view of a manufacturing apparatus.

FIG. 2 is a top view illustrating an example of a microwave plasma apparatus. A common chamber 1120 is connected to load/unload (L/UL) chambers 1110 and 1115 and reaction chambers (1) 1111 to (4) 1114 via gate valves 1122 to 1127. A substrate 1130 is set in a cassette 1128 of the load/unload (L/UL) chamber 1110 or a cassette 1129 of the load/unload (L/UL) chamber 1115 and transferred to the reaction chambers by a transfer unit 1121 of the common chamber 1120.

In FIG. 2, the microwave plasma CVD apparatus is provided with a plurality of load/unload (L/UL) chambers but may be provided with only one load/unload (L/UL) chamber. In addition, the high-density plasma CVD apparatus may be provided with a pretreatment chamber. By pre-heating the substrate in the pretreatment chamber, heating time before deposition in each reaction chamber can be shortened; accordingly, the throughput can be improved.

Figure 3:
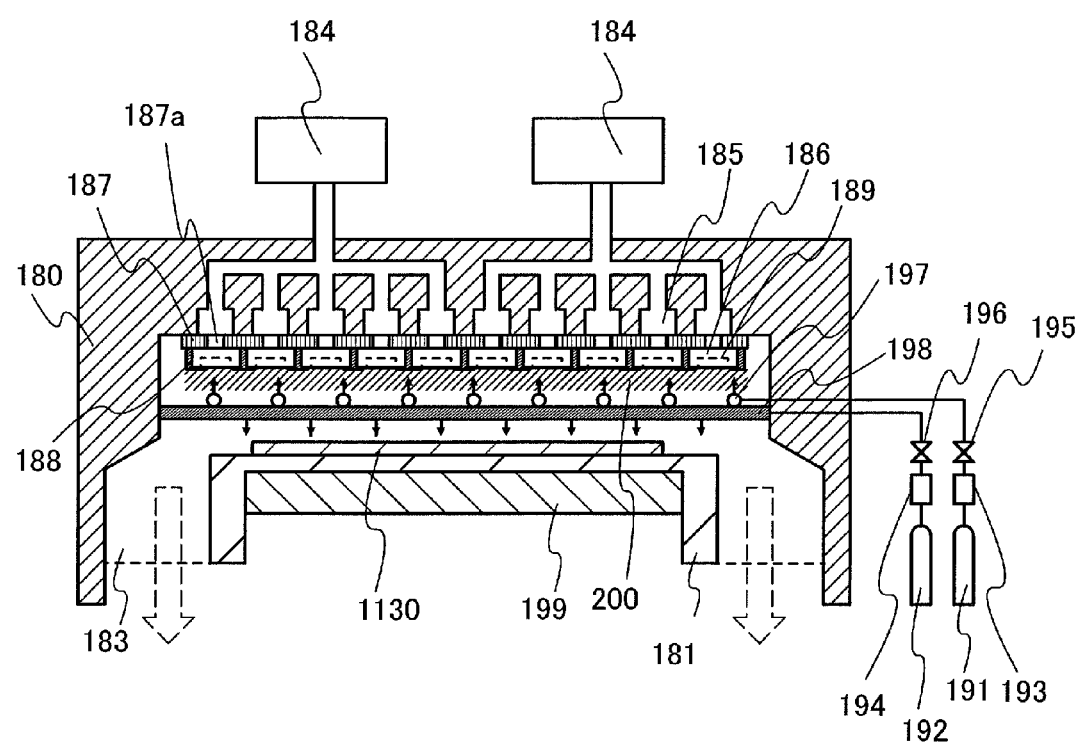
FIG. 3 is a cross-sectional view of a manufacturing apparatus.

FIG. 3 illustrates a detailed structure of a reaction chamber of the microwave plasma CVD apparatus used for forming a gate insulating film.

The reaction chamber of the microwave plasma CVD apparatus includes a treatment container 180, a support 181 which is provided in the treatment container 180 and on which the substrate 1130 is set, an exhaust port 183 connected to a vacuum pump for exhausting a gas in the treatment container 180, a microwave generation unit 184 for supplying microwaves for generating plasma, a waveguide 185 for introducing microwaves from a microwave supply unit to the treatment container 180, a top plate 187 which is in contact with the waveguide 185 and has openings 187a, and a plurality of dielectric plates 186 fixed to the top plate 187 with a fixing member 188. The substrate 1130 is provided to face the dielectric plates 186. As the vacuum pump, a dry pump for low vacuum evacuation and a turbo molecular pump for high vacuum evacuation can be used. In this embodiment, a substrate having a size of 600 mm×720 mm is used as the substrate 1130. Note that there is no limitation on the size of the substrate.

Further, a gas pipe 197 through which a non-source gas flows and a gas pipe 198 through which a source gas flows are provided between the substrate 1130 and the dielectric plates 186. The gas pipe 197 through which a non-source gas flows is connected to a non-source gas supply source 191 via a valve 195 and a mass flow controller 193. The gas pipe 198 through which a source gas flows is connected to a source gas supply source 192 via a valve 196 and a mass flow controller 194.

By provision of a temperature control portion 199 for the support 181, the temperature of the substrate 1130 can be controlled. A high-frequency power source may be connected to the support 181, so that predetermined bias voltage is applied to the support 181 by AC electric power output from the high-frequency power source. Note that the microwave generation unit 184 is preferably provided outside the treatment container 180.

The microwave generation unit 184 supplies microwaves. When the plurality of microwave generation units 184 is provided, stable large-sized plasma can be generated. Therefore, a highly uniform film can be formed over a large-sized substrate with one side of over 600 mm, particularly over 1000 mm, and the deposition rate can be increased.

The treatment container 180 and the top plate 187 are formed using metal whose surface is covered with an insulating film of alumina, silicon oxide, or a fluorine resin, for example, an alloy including aluminum. Further, the fixing member 188 is formed using metal such as an alloy including aluminum.

The dielectric plates 186 are provided so as to be in close contact with the openings of the top plate 187. The microwaves generated in the microwave generation unit 184 are propagated to the dielectric plates 186 by passing through the waveguide 185 and the openings 187a of the top plate 187 and transmitted through the dielectric plates 186 to be released into the treatment container.

By field effect energy of the microwaves released into the treatment container, the non-source gas is excited into a plasma state. This plasma 200 has higher density on the surface of the dielectric plates 186; thus, damage to the substrate 1130 can be reduced.

By provision of the plurality of dielectric plates 186, uniform large-sized plasma can be generated and maintained. The dielectric plates 186 are formed using ceramics such as sapphire, quartz glass, alumina, silicon oxide, or silicon nitride.

The dielectric plates 186 may have a recessed portion 189 on the side where the plasma 200 is generated. With the recessed portion 189, stable plasma can be generated. Furthermore, by provision of the plurality of dielectric plates 186, a highly uniform film can be formed over a large-sized substrate with one side of over 600 mm, particularly over 1000 mm, and the deposition rate can be increased.

The non-source gas flows through the plurality of gas pipes 197 on the upper side, and the source gas flows through the plurality of gas pipes 198 on the lower side. The gas pipes 197 and 198 are provided to intersect with each other. Outlets of the gas pipes 197 through which the non-source gas flows are provided on the dielectric plates 186 side, and outlets of the gas pipes 198 through which the source gas flows are provided on the substrate 1130 side. When the plurality of gas pipes 197 and the plurality of gas pipes 198 are provided to intersect with each other, the distance between the gas pipes can be shortened and thus the distance between the outlets can be shortened; accordingly, deposition can be uniformly performed over the substrate 1130. This structure is particularly effective when a large-sized substrate is used.

By ejecting the non-source gas toward the dielectric plates 186, the plasma 200 can be generated while a film is prevented from being formed on the surface of the dielectric plates 186. Further, since the source gas is ejected toward the substrate 1130, the source gas can be ejected from a position closer to the substrate 1130, and thus the deposition rate can be increased. Note that part of the source gas can flow through the gas pipes 197 on the upper side.

The gas pipes 197 and 198 are formed using ceramics such as alumina or aluminum nitride. Transmissivity of the microwaves is high in ceramics; therefore, when the gas pipes 197 and 198 are formed using ceramics, distribution of the plasma can be uniform without an electric field being disturbed, even when the gas pipes are provided right under the dielectric plates 186.

Deposition treatment of the gate insulating film 102 is described below.

Figure 4:
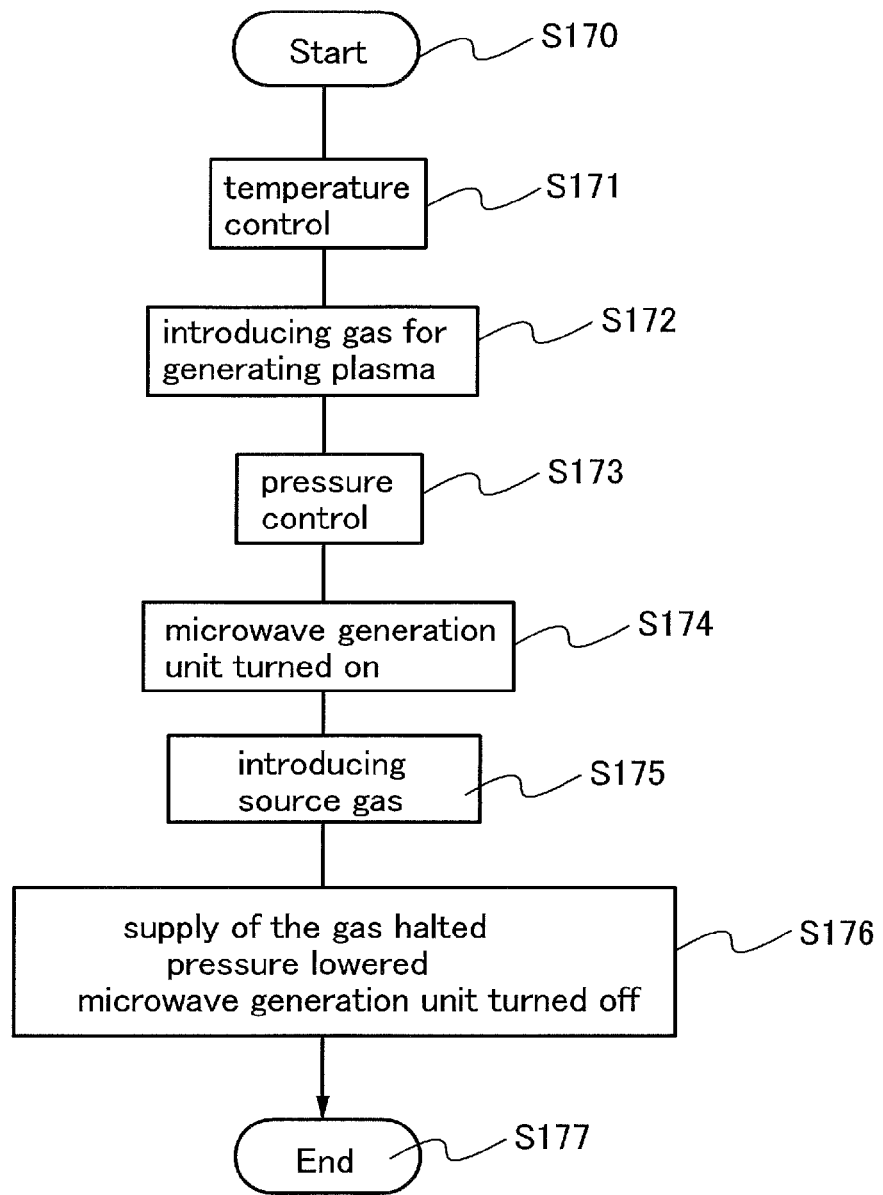
FIG. 4 is a flow chart.

First, the deposition treatment starts at a step S170 in FIG. 4. The temperature of the substrate 1130 is controlled at a step S171. The substrate 1130 is at room temperature or heated to 100° C. to 550° C. by the temperature control portion 199.

At a step S172, the inside of the treatment container 180 is made into a vacuum state, and one or more rare gases such as helium, argon, xenon, and krypton are introduced into the treatment container 180 as a gas for generating plasma. When oxygen is introduced into the treatment container 180 together with the rare gas, plasma can be easily generated. Note that the distance between the substrate 1130 and the dielectric plates 186 is approximately 10 mm to 200 mm (preferably 110 mm to 160 mm).

Next, at a step S173, the pressure in the treatment container 180 is set at predetermined pressure, 1 Pa to 200 Pa, preferably 1 Pa to 100 Pa, more preferably 1 Pa to 40 Pa.

Then, at a step S174, the microwave generation unit 184 is turned on, and microwaves are supplied from the microwave generation unit 184 to the waveguide 185, so that plasma is generated in the treatment container 180. The output power of the microwave generation unit is set at 500 W to 6000 W, preferably 4000 W to 6000 W. By excitation of plasma by introducing the microwaves, plasma with low electron temperature (higher than or equal to 0.7 eV and lower than or equal to 3 eV, preferably higher than or equal to 0.7 eV and lower than or equal to 1.5 eV) and high electron density ($1 \times 10^{11}$ atoms/cm$^3$ to $1 \times 10^{13}$ atoms/cm$^3$) can be generated.

Next, at a step S175, a source gas is introduced from the gas pipes 198 into the treatment container 180. Specifically, supply of oxygen is halted, and dinitrogen monoxide, a rare gas, and silicon hydride or silicon halide are introduced as a source gas, whereby a silicon oxynitride film can be formed over the substrate 1130.

Then, at a step S176, supply of the source gas is halted, the pressure in the treatment container is lowered, and the microwave generation unit is turned off, so that the deposition process finishes at a step S177.

In the above method for deposition treatment of a silicon oxynitride film, a silicon oxynitride film which withstands high voltage can be formed under the following conditions: the substrate temperature is 300° C. to 350° C.; and the flow rate of dinitrogen monoxide is greater than or equal to 10 times and less than or equal to 300 times, preferably greater than or equal to 50 times and less than or equal to 200 times, of that of silicon hydride or silicon halide. In addition, the withstand voltage of the silicon oxynitride film can be increased under the following conditions: 2 to 6 microwave generation units with power of 5 kW are used; the pressure in the treatment container is 10 Pa to 100 Pa, preferably 10 Pa to 50 Pa; and the distance between the substrate 1130 and the dielectric plates 186 is greater than or equal to 110 mm and less than or equal to 160 mm.

Figure 16:
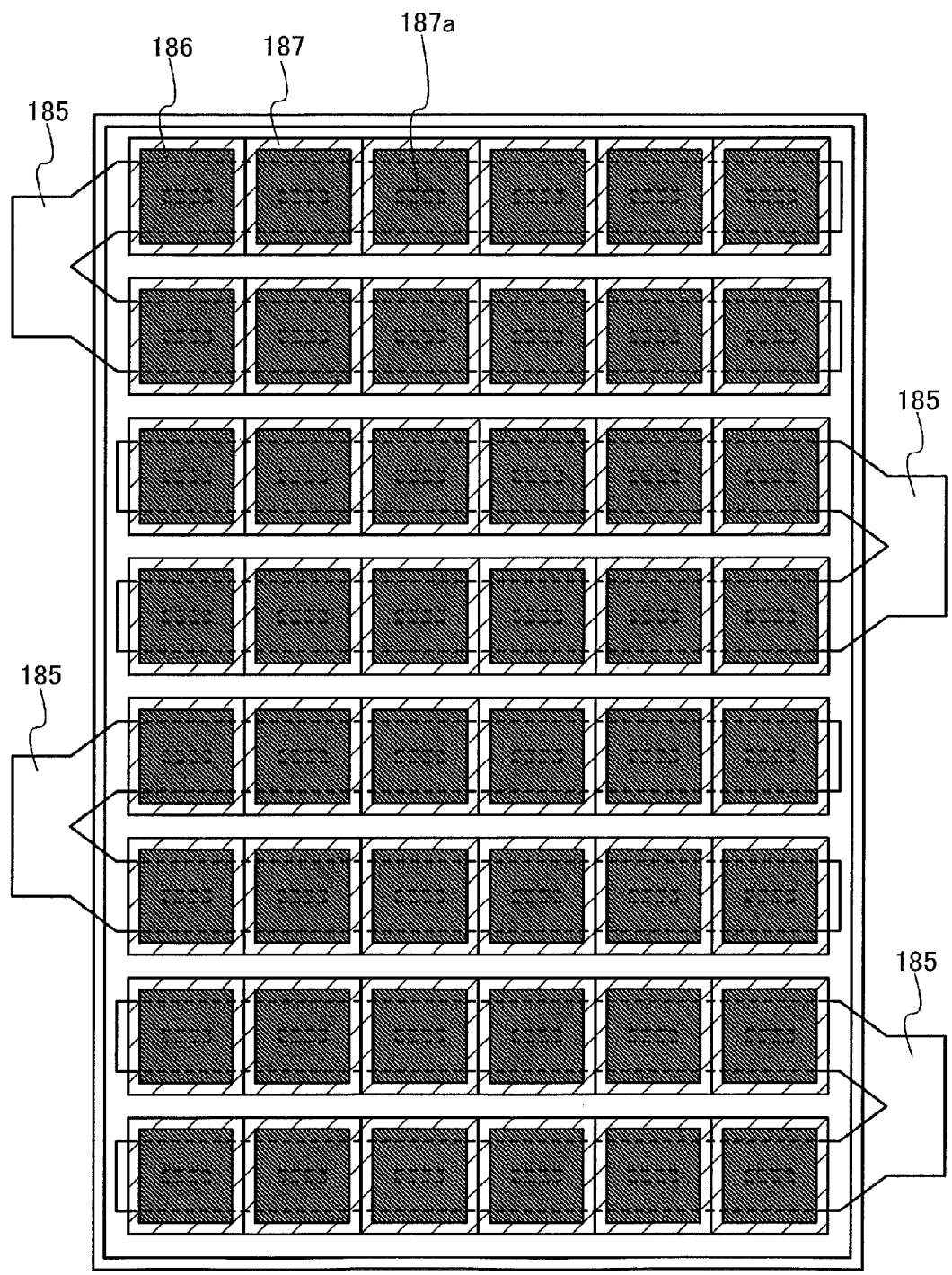
FIG. 16 is a plan view of a manufacturing apparatus.

FIG. 16 is a plain view illustrating an example of a structure of the waveguide 185. The waveguide 185 extends in parallel with the top plate 187, and the plurality of waveguides 185 is provided in parallel with each other. The dielectric plates 186 are provided on the top plate 187 in a matrix form. The waveguides 185 and the openings 187a formed in the top plate 187 are provided to be aligned with the dielectric plates 186. When the substrate to be processed has a large area (e.g., when a glass substrate of 730 mm×920 mm or a glass substrate which has one side exceeding 1 m is used), the waveguide 185 is preferably divided into plural parts and microwaves are supplied. FIG. 16 illustrates a structure in which branch waveguides are used at an end portion of each waveguide 185, and the microwaves divided into a plurality are supplied. A microwave power supply is connected to the tip of each branch waveguide. Use of a plurality of microwave power supplies makes it possible to keep uniformity of plasma even when the area of the substrate to be processed becomes large.

Although a silicon oxynitride film is formed as the gate insulating film in this embodiment, a silicon nitride film can also be formed. In that case, silane and nitrogen can be used as a source gas.

FIG. 10A shows the characteristics of a thin film transistor whose gate insulating film is formed with the microwave plasma CVD apparatus described in this embodiment, and FIG. 10B shows the characteristics of a thin film transistor whose gate insulating film is formed with a conventional plasma CVD apparatus. The results are compared with each other.

When the two thin film transistors are compared, especially in a gate bias-temperature (BT) test, the amount of threshold voltage (Vth) shift in the thin film transistor formed by the conventional method (FIG. 10B) is more than ±1.0, while the amount of threshold voltage (Vth) shift in the thin film transistor of this embodiment (FIG. 10A) is reduced to lower than ±1.0. Thus, the reliability is largely improved. Here, the gate BT test is a test for evaluating the reliability of a transistor from the amount of shift in threshold voltage (Vth) or the like. The smaller the shift amount is, the more stable the operation of a transistor is and the higher the reliability thereof is.

Moreover, as for threshold voltage (Vth), the thin film transistor formed by the conventional method (FIG. 10B) is normally on and variation in a substrate surface is ±4.2 V, while the thin film transistor of this embodiment (FIG. 10A) is normally off and variation in a substrate surface is largely reduced to ±1.0 V.

As described above, by forming a gate insulating film with use of a microwave plasma CVD apparatus, dangling bonds in the gate insulating film are reduced and the interface between the gate insulating film and an oxide semiconductor can be favorable. Accordingly, the characteristics of a manufactured thin film transistor can be improved.

This embodiment can be combined with any of the other embodiments as appropriate.

Embodiment 3

In this embodiment, an example of a structure of a microwave plasma CVD apparatus, which is different from that of Embodiment 2, will be described with reference to FIG. 5.

In Embodiment 2, the source gas ejected from the gas pipes 198 on the lower side is blown up by the non-source gas ejected from the gas pipes 197 on the upper side as illustrated in FIG. 3. The blown source gas is deposited on the dielectric plates 186 or the like as powder or a film. The deposited powder or film might fall onto the substrate 1130 over time and cause a particle. In this embodiment, a structure with which particles are reduced is described.

Figure 5:
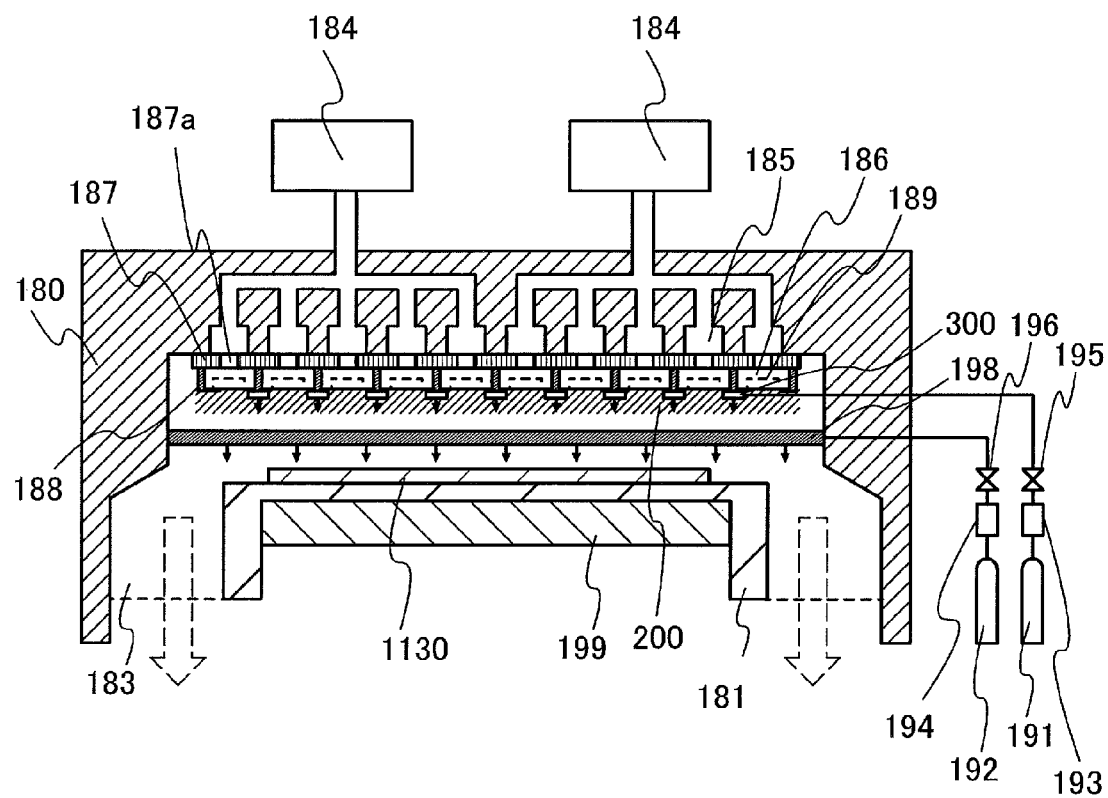
FIG. 5 is a cross-sectional view of a manufacturing apparatus.

A reaction chamber illustrated in FIG. 5 includes, instead of the gas pipes 197 on the upper side in FIG. 3, a plurality of members 300 (also referred to as beams) provided in parallel with the dielectric plates 186. Gas outlets of the members 300 are provided on the substrate 1130 side and eject a non-source gas. In addition, gas outlets of the gas pipes 198 provided between the substrate 1130 and the dielectric plates 186 are provided on the substrate 1130 side and eject a source gas. That is, both the gas pipes 198 and the members 300 eject the gasses to the substrate 1130 side.

Note that the outlets of the members 300 are connected to the non-source gas supply source 191 via a gas pipe inside the apparatus, the valve 195, and the mass flow controller 193. Further, the gas pipes 198 through which the source gas flows are connected to the source gas supply source 192 via the valve 196 and the mass flow controller 194. Note that a structure in which part of the source gas is ejected from the members 300 can also be employed.

Further, the gas pipes 198 are preferably provided to intersect with the members 300 having the outlets. As illustrated in FIG. 5, when the plurality of gas pipes 198 and the plurality of members 300 are provided to intersect with each other, the distance between the members 300 and the distance between the gas pipes 198 can be shortened and thus the distance between the outlets can be shortened; accordingly, deposition can be uniformly performed over the substrate 1130. This structure is particularly effective when a large-sized substrate is used. It is also effective that the outlets of the members 300 do not overlap with the gas pipes 198. If they overlap with each other, the gas ejected from the members 300 might be blown up.

When both the source gas and the non-source gas are ejected to the substrate 1130 side as in this embodiment, the source gas can be prevented from being blown up and generation of particles can be suppressed. The structure of this embodiment is particularly effective when the flow rate ratio of dinitrogen monoxide to silane is high, because particles are easily generated under such a condition.

With the structure of this embodiment, the characteristics of a thin film transistor described in Embodiment 2 can be obtained, and further, the yield can be largely improved.

This embodiment can be combined with any of the other embodiments as appropriate.

Embodiment 4

Figure 6:
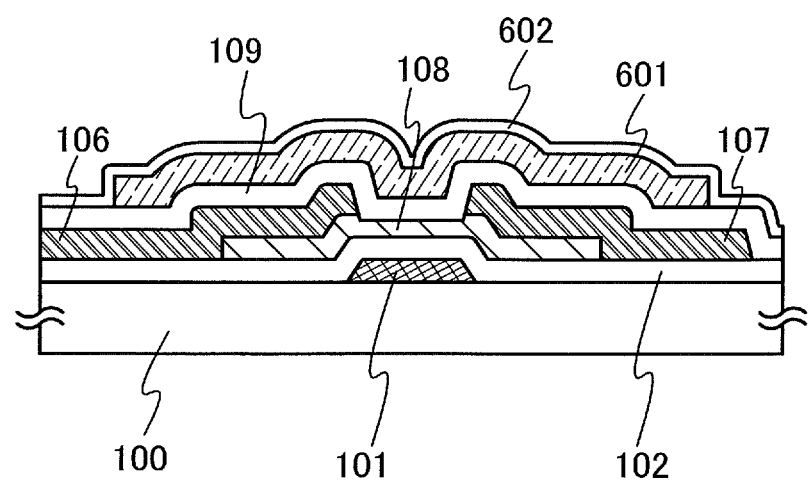
FIG. 6 is a cross-sectional view of a semiconductor device.

In this embodiment, an example of a bottom-gate thin film transistor having a channel-etched structure, which is different from that of Embodiment 1, will be described with reference to FIG. 6.

The thin film transistor is manufactured by sequentially forming the gate electrode 101, the gate insulating film 102, the oxide semiconductor film 108, the source electrode 106 and the drain electrode 107, the insulating film 109, a backgate electrode 601, and an insulating film 602 over the substrate 100 with an insulating property.

In order to form the gate insulating film 102, the microwave plasma CVD apparatus described in Embodiment 2 or 3 can be used. Dangling bonds in the gate insulating film 102 can be reduced and the interface between the oxide semiconductor film 108 and the gate insulating film 102 can be favorable.

The back-gate electrode 601 is formed in a position overlapping with the oxide semiconductor film 108 in such a manner that a conductive film is formed over the insulating film 109 and then the conductive film is patterned. The back-gate electrode 601 can be formed using a material and a structure similar to those of the gate electrode 101, or the source electrode 106 and the drain electrode 107.

The thickness of the back-gate electrode 601 is 10 nm to 400 nm, preferably 100 nm to 200 nm. In this embodiment, a conductive film having a structure in which a titanium film, an aluminum film, and a titanium film are stacked is formed. Then, a resist mask is formed by a photolithography method, and an unnecessary portion is removed by etching so that the conductive film is processed (patterned) into a desired shape; thus, the back-gate electrode 601 is formed.

The insulating film 602 is preferably formed using a material with a high barrier property that can prevent moisture, hydrogen, oxygen, and the like in an atmosphere from affecting the characteristics of the transistor. For example, the insulating film can be formed to have a single-layer structure or a stacked-layer structure using an insulating film with a high barrier property such as a silicon nitride film, a silicon nitride oxide film, an aluminum nitride film, or an aluminum nitride oxide film by a plasma CVD method, a sputtering method, or the like. In order to obtain an effect of a barrier property, the insulating film 602 is preferably formed to a thickness of 15 nm to 400 nm, for example.

Note that the back-gate electrode 601 may be electrically insulated and in a floating state, or may be supplied with a potential. In the latter case, the back-gate electrode 601 may be supplied with the same potential as the gate electrode 101, or may be supplied with a fixed potential such as a ground potential. By controlling the level of a potential supplied to the back-gate electrode 601, the threshold voltage of the transistor is controlled; consequently, variation in the threshold voltage in a substrate surface can be reduced.

In FIGS. 11A and 11B, the characteristics of a thin film transistor provided with a back-gate electrode and those of a thin film transistor without a back-gate electrode are compared.

FIG. 11A shows the results in the case of forming a back-gate electrode as in this embodiment. FIG. 11B shows the results in the case of not forming a back-gate electrode as in Embodiment 1 (which is the same as FIG. 10A).

When the two thin film transistors are compared, variation in the threshold voltage (Vth) in a substrate surface of the thin film transistor provided with the back-gate electrode (FIG. 11A) is largely reduced to ±0.5 V. Therefore, with a back-gate electrode, the characteristics of a thin film transistor can be further improved.

This embodiment can be combined with any of the other embodiments as appropriate.

Embodiment 5

In this embodiment, a bottom-gate thin film transistor having a channel protective structure will be described with reference to FIG. 7.

Figure 7:
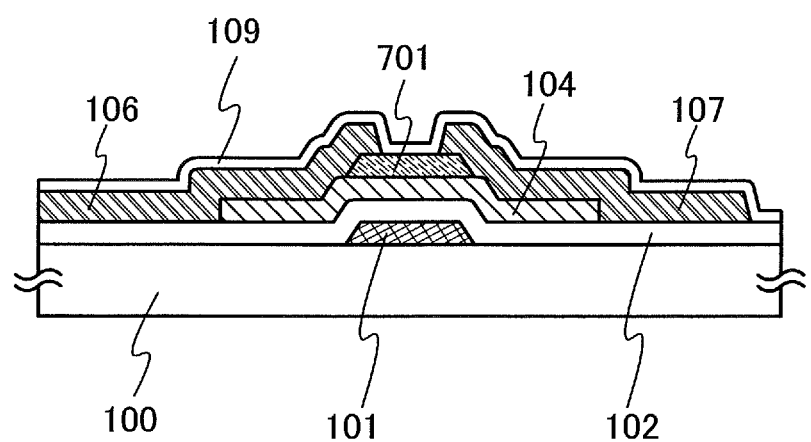
FIG. 7 is a cross-sectional view of a semiconductor device.

FIG. 7 illustrates an example of a cross-sectional structure of a bottom-gate thin film transistor having a channel protective structure.

The thin film transistor is manufactured by sequentially forming the gate electrode 101, the gate insulating film 102, the oxide semiconductor film 104, a channel protective film 701, the source electrode 106 and the drain electrode 107, and the insulating film 109 over the substrate 100 with an insulating property.

The channel protective film 701 is formed over the oxide semiconductor film 104 so as to overlap with a channel formation region of the oxide semiconductor film 104. The channel protective film 701 can prevent the portion of the oxide semiconductor film 104, which serves as the channel formation region, from being damaged in a later step (e.g., reduction in thickness due to plasma or an etchant in etching). Therefore, the reliability of the thin film transistor can be improved.

The channel protective film 701 can be formed using an inorganic material including oxygen (such as silicon oxide, silicon oxynitride, or silicon nitride oxide).

Here, in order to form the gate insulating film 102, the microwave plasma CVD apparatus described in Embodiment 2 or 3 can be used. Dangling bonds in the gate insulating film 102 can be reduced and the interface between the oxide semiconductor film 104 and the gate insulating film 102 can be favorable.

This embodiment can be combined with any of the other embodiments as appropriate.

Embodiment 6

In this embodiment, a top-gate thin film transistor will be described with reference FIG. 8.

Figure 8:
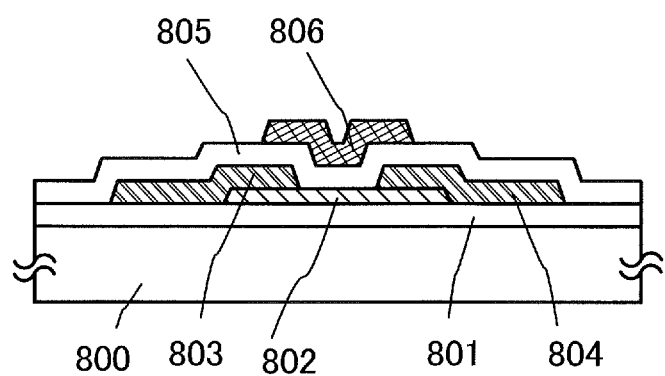
FIG. 8 is a cross-sectional view of a semiconductor device.

FIG. 8 illustrates an example of a cross-sectional structure of a top-gate thin film transistor.

The thin film transistor is manufactured by sequentially forming an insulating film 801, an oxide semiconductor film 802, a source electrode 803 and a drain electrode 804, a gate insulating film 805, and a gate electrode 806 over a substrate 800 having an insulating surface.

In order to form the gate insulating film 805, the microwave plasma CVD apparatus described in Embodiment 2 or 3 can be used. Dangling bonds in the gate insulating film 805 can be reduced and the interface between the oxide semiconductor film 802 and the gate insulating film 805 can be favorable.

This embodiment can be combined with any of the other embodiments as appropriate.

Embodiment 7

It is effective to use microwaves with a frequency of 1 GHz or lower in a microwave plasma CVD apparatus.

By using the microwaves with a frequency of 1 GHz or lower, the uniformity of plasma in a reaction chamber can be maintained even when the kind of gasses is changed or the pressure is changed in a wide range. The frequency is preferably 915 MHz.

In addition, when a structure like that in Embodiment 3, with which powder or a film of a source gas is prevented from being deposited in a reaction chamber, is employed, different films can be successively formed only by changing the kind of gasses. Therefore, it is particularly effective to combine the structure of this embodiment with the structure of Embodiment 3.

This embodiment can be combined with any of the other embodiments as appropriate.

Embodiment 8

In this embodiment, a gate insulating film having a structure different from that of other embodiments will be described. Any of the structures and manufacturing methods of other embodiments other than the gate insulating film can be applied to this embodiment.

By increasing the thickness of a gate insulating film, leakage current can be reduced and the reliability of a semiconductor device can be improved.

However, when the material of the gate insulating film described in Embodiment 1 is used, there is a possibility that the channel capacitance cannot be secured owing to increase in the thickness.

In this embodiment, therefore, the gate insulating film has a stacked-layer structure of a first insulating film formed by microwave plasma CVD and a second insulating film with a higher dielectric constant than the first insulating film.

At this time, the first insulating film formed by microwave plasma CVD is used as an insulating film that is in contact with an oxide semiconductor film, whereby the quality of the interface therebetween is improved. On the other hand, a thick insulating film with a higher dielectric constant than the first insulating film is used as the second insulating film that is not in contact with the oxide semiconductor, whereby the channel capacitance can be secured with leakage current suppressed.

As the insulating film with a high dielectric constant, an oxide film, a nitride film, an oxynitride film, a nitride oxide film, or the like including hafnium (Hf), zirconium (Zr), lanthanum (La), or the like can be used. For example, a film of hafnium oxide or the like may be formed by a sputtering method. Even when the second insulating film is formed by a sputtering method, the first insulating film is provided between the second insulating film and the oxide semiconductor; therefore, the quality of the interface with the oxide semiconductor is improved.

The gate insulating film of this embodiment may be applied to a bottom-gate transistor like that in FIGS. 1A to 1E, FIG. 6, or FIG. 7 or may be applied to a top-gate transistor like that in FIG. 8.

This embodiment can be combined with any of the other embodiments as appropriate.

Embodiment 9

In this embodiment, examples of electronic devices will be described.

Figure 9A:
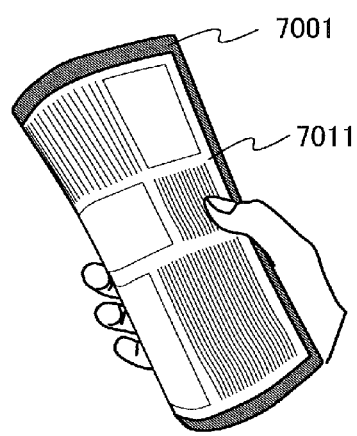
FIGS. 9A to 9E illustrate examples of electronic devices.
Figure 9B:
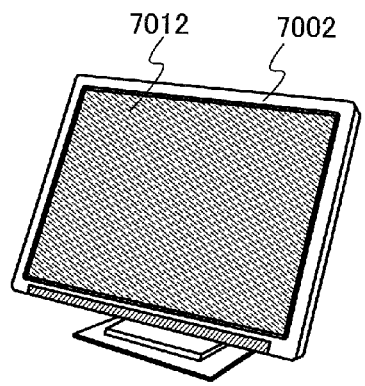
Figure 9C:
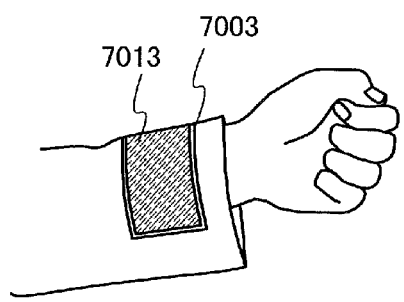
Figure 9D:
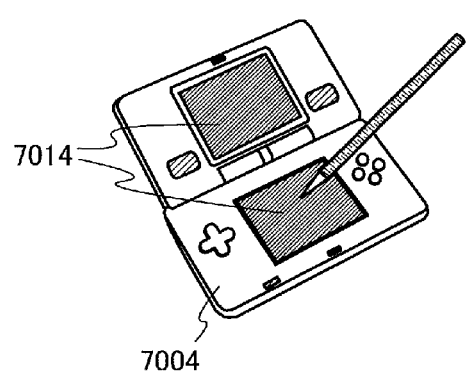
Figure 9E:
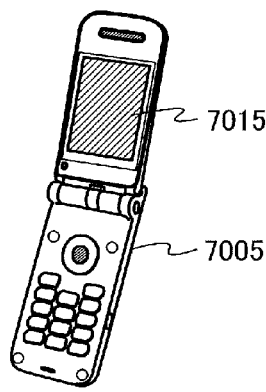

FIG. 9A illustrates an example of electronic paper (also referred to as an electronic book reader). FIG. 9B illustrates an example of a display device. FIG. 9C illustrates an example of a display device having flexibility. FIG. 9D illustrates an example of a portable game machine. FIG. 9E illustrates an example of a mobile phone.

In the electronic devices illustrated in FIGS. 9A to 9E, a semiconductor device according to an embodiment of the present invention can be used for display portions 7011 to 7015 provided for main bodies 7001 to 7005. Note that the semiconductor device according to an embodiment of the present invention can also be used for an electronic device which does not have a display portion.

This embodiment can be combined with any of the other embodiments as appropriate.

This application is based on Japanese Patent Application serial no. 2009-255154 filed with Japan Patent Office on Nov. 6, 2009, the entire contents of which are hereby incorporated by reference.

The invention claimed is:

1. A method for manufacturing a semiconductor device, comprising the steps of:
   forming a first insulating film over a substrate;
   forming an oxide semiconductor film on the first insulating film;
   performing heat treatment on the oxide semiconductor film in an atmosphere of an inert gas; and
   forming a second insulating film over the oxide semiconductor film,
   wherein an oxygen concentration of the second insulating film is higher than that of the oxide semiconductor film, and
   wherein the second insulating film extracts hydrogen in the oxide semiconductor film, and supplies oxygen to the oxide semiconductor film.

2. The method for manufacturing a semiconductor device according to claim 1,
   wherein the step of forming the first insulating film comprises the steps of:
   setting the substrate into a treatment container;
   introducing a first gas in the treatment container;
   generating plasma in the treatment container; and
   introducing a second gas in the treatment container.

3. The method for manufacturing a semiconductor device according to claim 2, wherein the first gas comprises a rare gas.

4. The method for manufacturing a semiconductor device according to claim 2, wherein the second gas comprises dinitrogen monoxide, a rare gas, and a gas including at least one of silicon hydride and silicon halide.

5. The method for manufacturing a semiconductor device according to claim 1, further comprising the step of:
   forming a gate electrode over the substrate before forming the first insulating film.

6. The method for manufacturing a semiconductor device according to claim 1, further comprising the step of:
   forming a gate electrode over the second insulating film.

7. The method for manufacturing a semiconductor device according to claim 1, wherein a hydrogen concentration of the oxide semiconductor film is less than $5\times10^{19}/\text{cm}^3$.

8. A method for manufacturing a semiconductor device, comprising the steps of:
   forming a first insulating film over a substrate;
   forming an oxide semiconductor film on the first insulating film;
   performing heat treatment on the oxide semiconductor film in an atmosphere of an inert gas; and
   forming a second insulating film over the oxide semiconductor film,
   wherein an oxygen concentration of the second insulating film is higher than that of the first insulating film, and
   wherein the second insulating film extracts hydrogen in the oxide semiconductor film, and supplies oxygen to the oxide semiconductor film.

9. The method for manufacturing a semiconductor device according to claim 8,
   wherein the step of forming the first insulating film comprises the steps of:
   setting the substrate into a treatment container;
   introducing a first gas in the treatment container;
   generating plasma in the treatment container; and
   introducing a second gas in the treatment container.

10. The method for manufacturing a semiconductor device according to claim 9, wherein the first gas comprises a rare gas.

11. The method for manufacturing a semiconductor device according to claim 9, wherein the second gas comprises dinitrogen monoxide, a rare gas, and a gas including at least one of silicon hydride and silicon halide.

12. The method for manufacturing a semiconductor device according to claim 8, further comprising the step of:
   forming a gate electrode over the substrate before forming the first insulating film.

13. The method for manufacturing a semiconductor device according to claim 8, further comprising the step of:
   forming a gate electrode over the second insulating film.

14. The method for manufacturing a semiconductor device according to claim 8, wherein a hydrogen concentration of the oxide semiconductor film is less than $5 \times 10^{19}/cm^3$.

15. The method for manufacturing a semiconductor device according to claim 1, wherein the inert gas is one of nitrogen, helium, neon, and argon.

16. The method for manufacturing a semiconductor device according to claim 8, wherein the inert gas is one of nitrogen, helium, neon, and argon.

17. The method for manufacturing a semiconductor device according to claim 1, wherein the first insulating film is formed by plasma CVD using microwaves of 300 MHz to 300 GHz.

18. The method for manufacturing a semiconductor device according to claim 8, wherein the first insulating film is formed by plasma CVD using microwaves of 300 MHz to 300 GHz.

19. The method for manufacturing a semiconductor device according to claim 1, wherein the first insulating film is formed under conditions that a substrate temperature is 300° C. to 350° C., and a flow rate of dinitrogen monoxide is greater than or equal to 10 times and less than or equal to 300 times of that of silicon hydride.

20. The method for manufacturing a semiconductor device according to claim 8, wherein the first insulating film is formed under conditions that a substrate temperature is 300° C. to 350° C., and a flow rate of dinitrogen monoxide is greater than or equal to 10 times and less than or equal to 300 times of that of silicon hydride.

* * * * *